(12) United States Patent
Saito et al.

(10) Patent No.: US 11,488,758 B2
(45) Date of Patent: Nov. 1, 2022

(54) EXCHANGE COUPLING FILM, AND MAGNETORESISTIVE SENSOR AND MAGNETIC DETECTOR INCLUDING THE SAME

(71) Applicant: Alps Alpine Co., Ltd., Tokyo (JP)

(72) Inventors: Masamichi Saito, Miyagi-ken (JP); Fumihito Koike, Miyagi-ken (JP); Hiroaki Endo, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 247 days.

(21) Appl. No.: 16/816,981

(22) Filed: Mar. 12, 2020

(65) Prior Publication Data

US 2020/0211746 A1 Jul. 2, 2020

Related U.S. Application Data

(63) Continuation of application No. PCT/JP2018/035590, filed on Sep. 26, 2018.

(30) Foreign Application Priority Data

Sep. 27, 2017 (JP) .............................. JP2017-186543

(51) Int. Cl.
*H01F 10/32* (2006.01)
*G01R 33/09* (2006.01)
(Continued)

(52) U.S. Cl.
CPC ......... *H01F 10/329* (2013.01); *G01R 33/093* (2013.01); *H01F 10/3272* (2013.01); *H01L 43/08* (2013.01); *H01L 43/10* (2013.01)

(58) Field of Classification Search
CPC .. G01R 1/00; G01R 27/00; H01F 1/00; B82Y 25/00
See application file for complete search history.

(56) References Cited

U.S. PATENT DOCUMENTS 6,327,123 B1 * 12/2001 Kawato ................ G11B 5/3909
360/324.11
2001/0043986 A1 * 11/2001 Saito ...................... B82Y 25/00
427/128

(Continued)

FOREIGN PATENT DOCUMENTS

| JP | 2000-215431 | 4/2000 |
| WO | WO 2018/029883 | 2/2018 |
| WO | WO 2018/030224 | 2/2018 |

OTHER PUBLICATIONS

International Search Report from corresponding application No. PCT/JP2018/035590, 2pgs, dated Dec. 4, 2018.

*Primary Examiner* — Jermele M Hollington
*Assistant Examiner* — Temilade S Rhodes-Vivour
(74) *Attorney, Agent, or Firm* — Crowell & Moring LLP

(57) ABSTRACT

In an exchange coupling film that has a large magnetic field (Hex) in which the direction of magnetization of a fixed magnetic layer is reversed, high stability under high temperature conditions, and excellent strong-magnetic field resistance, an antiferromagnetic layer, a fixed magnetic layer, and a free magnetic layer are stacked, the antiferromagnetic layer is composed of a PtCr layer and an XMn layer (where X is Pt or Ir), the XMn layer is in contact with the fixed magnetic layer, and the fixed magnetic layer is made of iron, cobalt, an iron-cobalt alloy, or an iron-nickel alloy.

20 Claims, 10 Drawing Sheets

(51) Int. Cl.
*H01L 43/08* (2006.01)
*H01L 43/10* (2006.01)

(56) References Cited

U.S. PATENT DOCUMENTS

| | | | |
|---|---|---|---|
| 2001/0053053 A1* | 12/2001 | Saito | B82Y 10/00 360/324.11 |
| 2003/0063415 A1* | 4/2003 | Hasegawa | B82Y 25/00 |
| 2003/0203241 A1* | 10/2003 | Ikarashi | B82Y 25/00 428/812 |
| 2018/0090256 A1* | 3/2018 | Noguchi | H01F 27/29 |
| 2019/0170835 A1 | 6/2019 | Saito et al. | |
| 2019/0189150 A1 | 6/2019 | Saito | |

\* cited by examiner

EXCHANGE COUPLING FILM, AND MAGNETORESISTIVE SENSOR AND MAGNETIC DETECTOR INCLUDING THE SAME

CLAIM OF PRIORITY

This application is a Continuation of International Application No. PCT/JP2018/035590 filed on Sep. 26, 2018, which claims benefit of priority to Japanese Patent Application No. 2017-186543 filed on Sep. 27, 2017. The entire contents of each application noted above are hereby incorporated by reference.

BACKGROUND

1. Field of the Disclosure

The present disclosure relates to an exchange coupling film and a magnetoresistive sensor and a magnetic detector each using the film.

2. Description of the Related Art

An exchange coupling film having an antiferromagnetic layer and a fixed magnetic layer may be used as a magnetoresistive sensor or a magnetic detector. Japanese Unexamined Patent Application Publication No. 2000-215431 describes that in a medium for magnetic recording, an exchange coupling film can be constituted by combining a Co alloy as a ferromagnetic layer and a variety of alloys as an antiferromagnetic layer. Examples presented for the antiferromagnetic layer include alloys such as CoMn, NiMn, PtMn, and PtCr.

The magnetic detector requires reflow treatment (melting treatment) of solder when a magnetic effect device is mounted on a substrate and may be used in a high temperature environment such as in the vicinity of an engine. Accordingly, it is preferable that the exchange coupling film used in a magnetic detector have a large magnetic field (Hex) in which the direction of magnetization of a fixed magnetic layer is reversed, in order to enable the detection of a magnetic field in a broad dynamic range, and high stability under high-temperature conditions.

Japanese Unexamined Patent Application Publication No. 2000-215431 relates to an exchange coupling film used as a magnetic recording medium and therefore does not describe the stability of the magnetic detector using an exchange coupling film under high-temperature conditions.

In addition, recently, it has been found desirable that the direction of magnetization of a fixed magnetic layer is less likely influenced even if the fixed magnetic layer is disposed in a vicinity of a high-magnetic field generation source, such as a large-output motor, i.e., in an environment where a strong magnetic field is applied to the layer. That is, strong-magnetic field resistance is required.

SUMMARY

The present invention provides an exchange coupling film that has a large magnetic field (Hex) in which the direction of magnetization of a fixed magnetic layer is reversed and therefore has high stability under high-temperature conditions and also has excellent strong-magnetic field resistance and also provides a magnetoresistive sensor and a magnetic detector each using the film.

In one aspect, an exchange coupling film is composed of a laminate of an antiferromagnetic layer and a fixed magnetic layer, wherein the antiferromagnetic layer is composed of a PtCr layer and an XMn layer (where X is Pt or Ir), the XMn layer is in contact with the fixed magnetic layer, and the fixed magnetic layer is made of iron, cobalt, a cobalt-iron alloy, or a nickel-iron alloy.

In another aspect, an exchange coupling film is composed of a laminate of an antiferromagnetic layer and a fixed magnetic layer, wherein the antiferromagnetic layer is composed of a PtCr layer and an XMn layer (where X is Pt or Ir), the XMn layer is in contact with the fixed magnetic layer, the fixed magnetic layer has a self-pinned structure composed of a laminate of a first magnetic layer, an intermediate layer, and a second magnetic layer, and the first magnetic layer and the second magnetic layer are each made of iron, cobalt, a cobalt-iron alloy, or a nickel-iron alloy.

In another aspect, a magnetoresistive sensor in which the exchange coupling film and a free magnetic layer are laminated.

In another aspect, a magnetic detector includes the above-described magnetoresistive sensor.

The magnetic detector includes a plurality of the magnetoresistive sensors on a single substrate, and some of the magnetoresistive sensors may have different fixed magnetization directions.

According to the present invention, an exchange coupling film having improved stability under high-temperature conditions and also having excellent strong-magnetic field resistance is provided. Accordingly, a magnetic detector being stable even if it is placed in a high-temperature environment or a strong magnetic field environment can be obtained by using a magnetoresistive sensor composed of a laminate of the exchange coupling film of the present invention and a free magnetic layer.

In addition, since a variety types of metals can be used as the fixed magnetic layer, the degree of freedom in design according to the properties required in the magnetic detector is high.

DESCRIPTION OF THE EXEMPLARY EMBODIMENTS

First Embodiment

Figure 1:
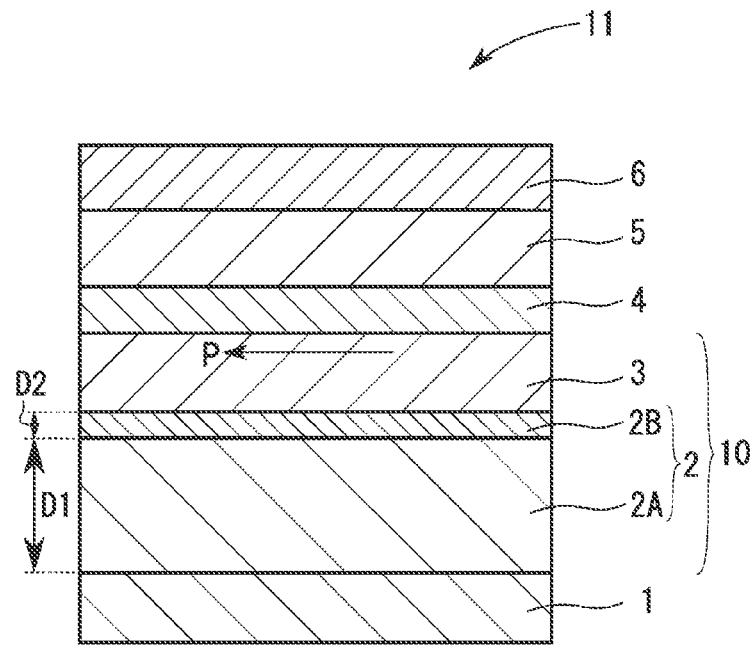
FIG. 1 is an explanatory drawing illustrating the film configuration of an exchange coupling film 10 of a first embodiment of the present invention.

FIG. 1 shows the film configuration of a magnetic detection device 11 using an exchange coupling film 10 according to a first embodiment of the present invention.

The magnetic detection device 11 is formed by stacking a base layer 1, an antiferromagnetic layer 2, a fixed magnetic layer 3, a non-magnetic material layer 4, a free magnetic layer 5, and a protective layer 6 in this order on a surface of a substrate. The antiferromagnetic layer 2 is composed of a PtCr layer 2A and an XMn layer (where X is Pt or Ir) 2B, and the XMn layer 2B is in contact with the fixed magnetic layer 3. Each of these layers is formed by, for example, a sputtering process or a CVD process. The antiferromagnetic layer 2 and the fixed magnetic layer 3 constitute the exchange coupling film 10 of the first embodiment of the present invention.

The magnetic detection device 11 is a laminated device utilizing a so-called giant magnetoresistance effect (GMR effect) of a single spin valve, and the electric resistance changes based on the relative relationship between the fixed magnetization vector of the fixed magnetic layer 3 and the magnetization vector that changes by the external magnetic field of the free magnetic layer 5.

The base layer 1 is formed of, for example, a NiFeCr alloy (nickel-iron-chromium alloy), Cr, or Ta. In the exchange coupling film 10 of the present embodiment, in order to increase the magnetic field (hereinafter, appropriately also referred to as "Hex") in which the direction of magnetization of the fixed magnetic layer 3 is reversed, a NiFeCr alloy is preferred.

The antiferromagnetic layer 2 has a layered structure composed of a PtCr layer 2A and an XMn layer 2B (where X is Pt or Ir). In order to increase the Hex, the thickness D1 of the PtCr layer 2A in the antiferromagnetic layer 2 is preferably larger than the thickness D2 of the XMn layer 2B. The ratio of the thickness D1 and the thickness D2, D1:D2, is more preferably 5:1 to 100:1 and further preferably 10:1 to 50:1.

From the viewpoint of increasing the Hex, the PtCr layer 2A is preferably made of $Pt_XCr_{100-X}$ (X is 45 at % or more and 62 at % or less) and more preferably $Pt_XCr_{100-X}$ (X is 50 at % or more and 57 at % or less). From the same viewpoint, XMn layer 2B is preferably a PtMn layer.

In the present embodiment, the antiferromagnetic layer 2 is ordered by annealing treatment to generate exchange coupling with the fixed magnetic layer 3 (at the interface). The Hex of the exchange coupling film 10 is increased by the magnetic field (exchange coupling field) based on the exchange coupling, and the strong-magnetic field resistance is also improved.

The fixed magnetic layer 3 is formed of Fe (iron), Co (cobalt), a CoFe alloy (cobalt-iron alloy), or a NiFe alloy (nickel-iron alloy). The CoFe alloy and the NiFe alloy each increase the coercive force with an increase in the content of Fe. The fixed magnetic layer 3 is a layer contributing to the giant magnetoresistance effect of a spin valve, and the direction in which the fixed magnetization direction P of the fixed magnetic layer 3 extends is the sensitivity axial direction of the magnetic detection device 11.

The exchange coupling film 10 can have a high Hex regardless of the Fe content in the fixed magnetic layer 3. This is because that the antiferromagnetic layer 2 having the above-described layered structure can be exchange coupled with a variety of types of ferromagnetic materials.

Figure 12:
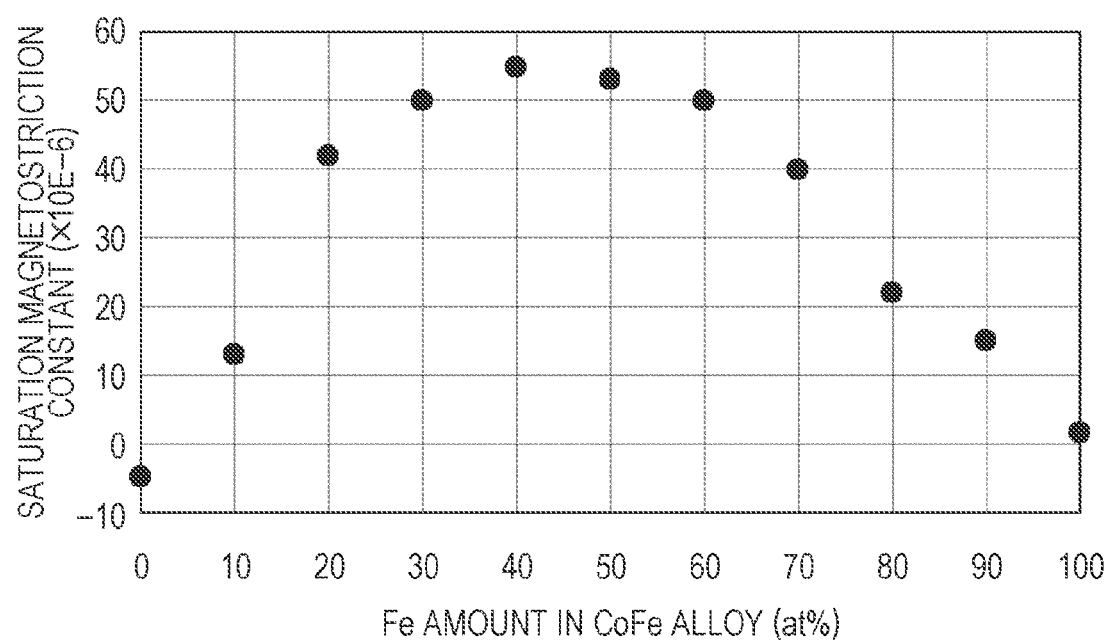
FIG. 12 is a graph showing a relationship between the Fe amount (at %) in a CoFe alloy and the saturation magnetostriction constant.

FIG. 12 is a graph showing a relationship between the Fe amount (at %) in CoFe alloys and the saturation magnetostriction constant (cited from O. V. Auwers and H. Neumann, Wiss. Veroffentlich, Siemens, 14, 93 (1935)). As shown in this graph, the magnetostriction of CoFe alloys varies depending on the difference in the composition. In the case of a positive saturation magnetostriction constant, when a tensile stress is applied to a magnetic film having a positive magnetostriction constant, the magnetization of the magnetic film tends to be oriented in the direction of the tensile stress by the amount of (magnetostriction constant)×(stress), because the energy decreases by the amount of (magnetostriction constant)×(stress). Since a magnetic film having zero magnetostriction does not cause a difference in energy even if any stress is applied thereto, the stress resistance is high. Since various stresses are applied to the elements of a magnetic sensor, low magnetostriction is preferred in many cases so that the magnetization direction does not change due to the stress.

As described above, from the viewpoint of magnetostriction, the exchange coupling film 10 may be restricted in design. However, when the exchange coupling film 10 uses, for example, a CoFe alloy as the fixed magnetic layer 3, a high Hex is obtained regardless of the composition thereof in a broad Fe content of 0 to 100 at %. Thus, since the exchange coupling film 10 can use a variety of types of metals (specifically, for example, pure iron (Fe) and pure cobalt (Co)) and alloys as the fixed magnetic layer 3, the selection range of the materials that can be used is wide, and it is excellent in that the degree of freedom in design is higher than before.

The non-magnetic material layer 4 can be formed using, for example, Cu (copper) or Ru (ruthenium).

Although the material and structure of the free magnetic layer 5 are not limited, for example, the free magnetic layer 5 can be formed of a CoFe alloy (cobalt-iron alloy) or a NiFe alloy (nickel-iron alloy) and can be formed as a monolayer structure, a layered structure, or a layered ferri structure.

The protective layer 6 can be formed of, for example, Ta (tantalum).

Incidentally, when an alloy layer, such as the PtCr layer 2A of the exchange coupling film 10, is formed, a plurality of metals forming the alloy (Pt and Cr in the case of the PtCr layer 2A) may be simultaneously supplied, or a plurality of metals forming the alloy may be alternately supplied. Examples of the former include co-sputtering of a plurality of metals forming an alloy, and examples of the later include layer-by-layer deposition of different metal layers. In some cases, simultaneous supply of a plurality of metals forming an alloy is preferable than alternate supply for increasing the Hex.

Second Embodiment

Figure 2:
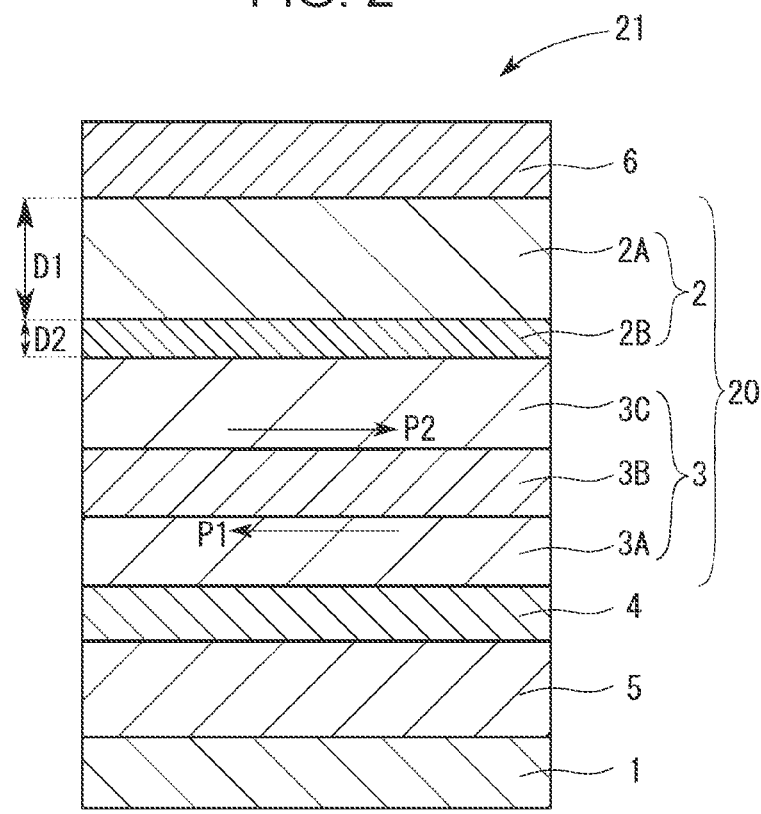
FIG. 2 is an explanatory drawing illustrating the film configuration of an exchange coupling film 20 of a second embodiment of the present invention.

FIG. 2 shows an explanatory drawing illustrating the film configuration of a magnetic detection device (magnetoresistive sensor) 21 using an exchange coupling film 20 of a second embodiment of the present invention. In the present embodiment, the layers having the same functions as those of the magnetic detection device 11 shown in FIG. 1 are denoted by the same reference numerals, and the description thereof is omitted.

The magnetic detection device 21 of the second embodiment shown in FIG. 2 differs from the magnetic detection device 11 of FIG. 1 in that the exchange coupling film 20 is composed of a fixed magnetic layer 3 having a self-pinned structure and an antiferromagnetic layer 2 joined to each other and that a non-magnetic material layer 4 and a free magnetic layer 5 are formed on the base layer 1 side than the fixed magnetic layer 3.

The magnetic detection device 21 is also a laminated device utilizing a so-called giant magnetoresistance effect of a single spin valve. The electric resistance changes based on the relative relationship between the fixed magnetization vector of a first magnetic layer 3A of the fixed magnetic layer 3 and the magnetization vector that changes by the external magnetic field of the free magnetic layer 5.

The fixed magnetic layer 3 has a self-pinned structure composed of the first magnetic layer 3A, a second magnetic layer 3C, and a non-magnetic intermediate layer 3B positioned between these two layers. The fixed magnetization direction P1 of the first magnetic layer 3A and the fixed magnetization direction P2 of the second magnetic layer 3C are antiparallel due to the interaction. The fixed magnetization direction P1 of the first magnetic layer 3A adjacent to the non-magnetic material layer 4 is the fixed magnetization direction of the fixed magnetic layer 3. The direction in which the fixed magnetization direction P1 extends is the sensitivity axial direction of the magnetic detection device 11.

The first magnetic layer 3A and the second magnetic layer 3C are each formed of Fe (iron), Co (cobalt), a CoFe alloy (iron-cobalt alloy) or a NiFe alloy (nickel-iron alloy). The CoFe alloy and the NiFe alloy each increase the coercive force with an increase in the content of Fe. The first magnetic layer 3A adjacent to the non-magnetic material layer 4 is a layer contributing to the giant magnetoresistance effect of a spin valve.

The non-magnetic intermediate layer 3B is formed of, for example, Ru (ruthenium). The non-magnetic intermediate layer 3B made of Ru preferably has a thickness of 3 to 5 angstrom or 8 to 10 angstrom.

The selection range of the materials that can be used as the first magnetic layer 3A and the second magnetic layer 3C in the fixed magnetic layer 3 having a self-pinned structure of the present embodiment is wide, and the degree of freedom in design is higher than before as in the first embodiment.

Structure of magnetic sensor

Figure 3:
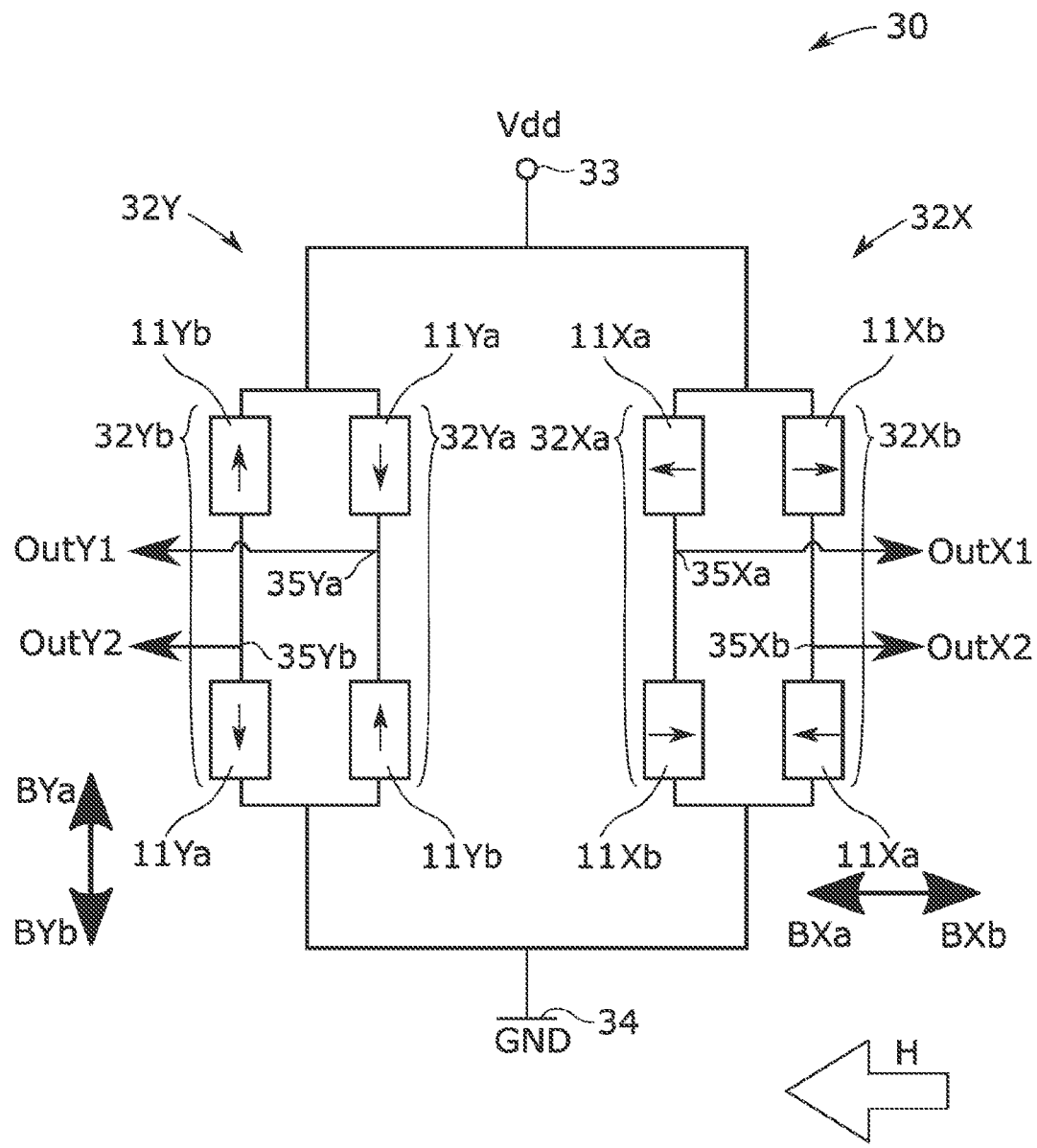
FIG. 3 is the circuit block diagram of a magnetic sensor 30 of an embodiment of the present invention.

FIG. 3 shows a magnetic sensor (magnetic detector) 30 including the magnetic detection device 11 shown in FIG. 1. In FIG. 3, magnetic detection devices 11 having different fixed magnetization directions P (see FIG. 1) are denoted by 11Xa, 11Xb, 11Ya, and 11Yb, respectively, for distinguishing them. In the magnetic sensor 30, the magnetic detection devices 11Xa, 11Xb, 11Ya, and 11Yb are disposed on a single substrate.

The magnetic sensor 30 shown in FIG. 3 includes a full bridge circuit 32X and a full bridge circuit 32Y, and a plurality of magnetic detection devices 11 (see FIG. 1) are provided on a single substrate. The full bridge circuit 32X includes two magnetic detection devices 11Xa and two magnetic detection devices 11Xb, and the full bridge circuit 32Y includes two magnetic detection devices 11Ya and two magnetic detection devices 11Yb. All of the magnetic detection devices 11Xa, 11Xb, 11Ya, and 11Yb have the same film structure as that of the exchange coupling film 10 of the magnetic detection device 11 shown in FIG. 1. When they are not particularly distinguished, hereinafter, the magnetic detection devices are appropriately referred to as magnetic detection devices 11.

The full bridge circuit 32X and the full bridge circuit 32Y differ from each other in that the magnetic detection devices 11 having different fixed magnetization directions, which are indicated by arrows in FIG. 3, for making the detection magnetic field directions different from each other, but the mechanisms for detecting the magnetic field are the same. Accordingly, a mechanism for detecting a magnetic field using the full bridge circuit 32X will now be described.

The full bridge circuit 32X is configured by connecting a first serial portion 32Xa and a second serial portion 32Xb in parallel. The first serial portion 32Xa is configured by connecting the magnetic detection device 11Xa and the magnetic detection device 11Xb in series, and the second serial portion 32Xb is configured by connecting the magnetic detection device 11Xb and the magnetic detection device 11Xa in series.

A source voltage Vdd is supplied to a power terminal 33 common to the magnetic detection devices 11Xa constituting the first serial portion 32Xa and the magnetic detection devices 11Xb constituting the second serial portion 32Xb. The ground terminal 34 common to the magnetic detection devices 11Xb constituting the first serial portion 32Xa and the magnetic detection devices 11Xa constituting the second serial portion 32Xb is set to the ground potential GND.

The differential output, (OutX1)–(OutX2), between the output potential (OutX1) in the middle point 35Xa of the first serial portion 32Xa constituting the full bridge circuit 32X and the output potential (OutX2) in the middle point 35Xb of the second serial portion 32Xb is obtained as a detection output (detection output voltage) VXs in the X direction.

When the full bridge circuit 32Y also acts similarly as in the full bridge circuit 32X, the differential output, (OutY1)–(OutY2), between the output potential (OutY1) in the middle point 35Ya of the first serial portion 32Ya and the output potential (OutY2) in the middle point 35Yb of the second serial portion 32Yb is obtained as a detection output (detection output voltage) VYs in the Y direction.

As indicated by arrows in FIG. 3, the sensitivity axial directions of each magnetic detection device 11Xa and each magnetic detection device 11Xb constituting the full bridge circuit 32X and the sensitivity axial directions of each magnetic detection device 11Ya and each magnetic detection device 11Yb constituting the full bridge circuit 32Y are orthogonal to each other.

In the magnetic sensor 30 shown in FIG. 3, the direction of the free magnetic layer 5 of each magnetic detection device 11 changes so as to follow the direction of the external magnetic field H. On this occasion, the resistance value changes based on the relationship between the vectors of the fixed magnetization direction P of the fixed magnetic layer 3 and the magnetization direction of the free magnetic layer 5.

For example, when the external magnetic field H acts on the direction shown in FIG. 3, in the magnetic detection device 11Xa constituting the full bridge circuit 32X, since the sensitivity axial direction and the direction of the external magnetic field H are the same, the electric resistance value is reduced. In contrast, in the magnetic detection device 11Xb, since the sensitivity axial direction and the direction of the external magnetic field H are opposite, the electric resistance value is increased. The change in the electric resistance value maximizes the detection output voltage VXs=(OutX1)−(OutX2). As the external magnetic field H changes rightward with respect to the plane of the paper, the detection output voltage VXs decreases. When the external magnetic field H is directed upward or downward with respect to the plane of the paper FIG. 3, the detection output voltage VXs becomes zero.

In contrast, in the full bridge circuit 32Y, when the external magnetic field H is directed leftward with respect to the plane of the paler as shown in FIG. 3, since the direction of magnetization of the free magnetic layer 5 in all of the magnetic detection devices 11 is orthogonal to the sensitivity axial direction (fixed magnetization direction P), the electric resistance values of the magnetic detection device 11Ya and the magnetic detection device 11Xb are the same. Accordingly, the detection output voltage VYs is zero. In FIG. 3, when the external magnetic field H acts downward with respect to the plane of the paper, the detection output voltage VYs=(OutY1)−(OutY2) of the full bridge circuit 32Y is maximized, and as the external magnetic field H changes upward with respect to the plane of the paper, the detection output voltage VYs decreases.

Thus, the change in the direction of the external magnetic field H causes changes in the respective detection output voltages VXs and VYs of the full bridge circuit 32X and the full bridge circuit 32Y. Accordingly, based on the detection output voltages VXs and VYs obtained from the full bridge circuit 32X and the full bridge circuit 32Y, respectively, the direction of movement and the amount of movement (relative position) of a detection object can be detected.

FIG. 3 shows a magnetic sensor 30 that can detect magnetic fields in the X direction and the Y direction orthogonal to the X direction. However, the magnetic sensor 30 may include only the full bridge circuit 32X or the full bridge circuit 32Y that detects a magnetic field in the X direction or the Y direction only.

Figure 4:
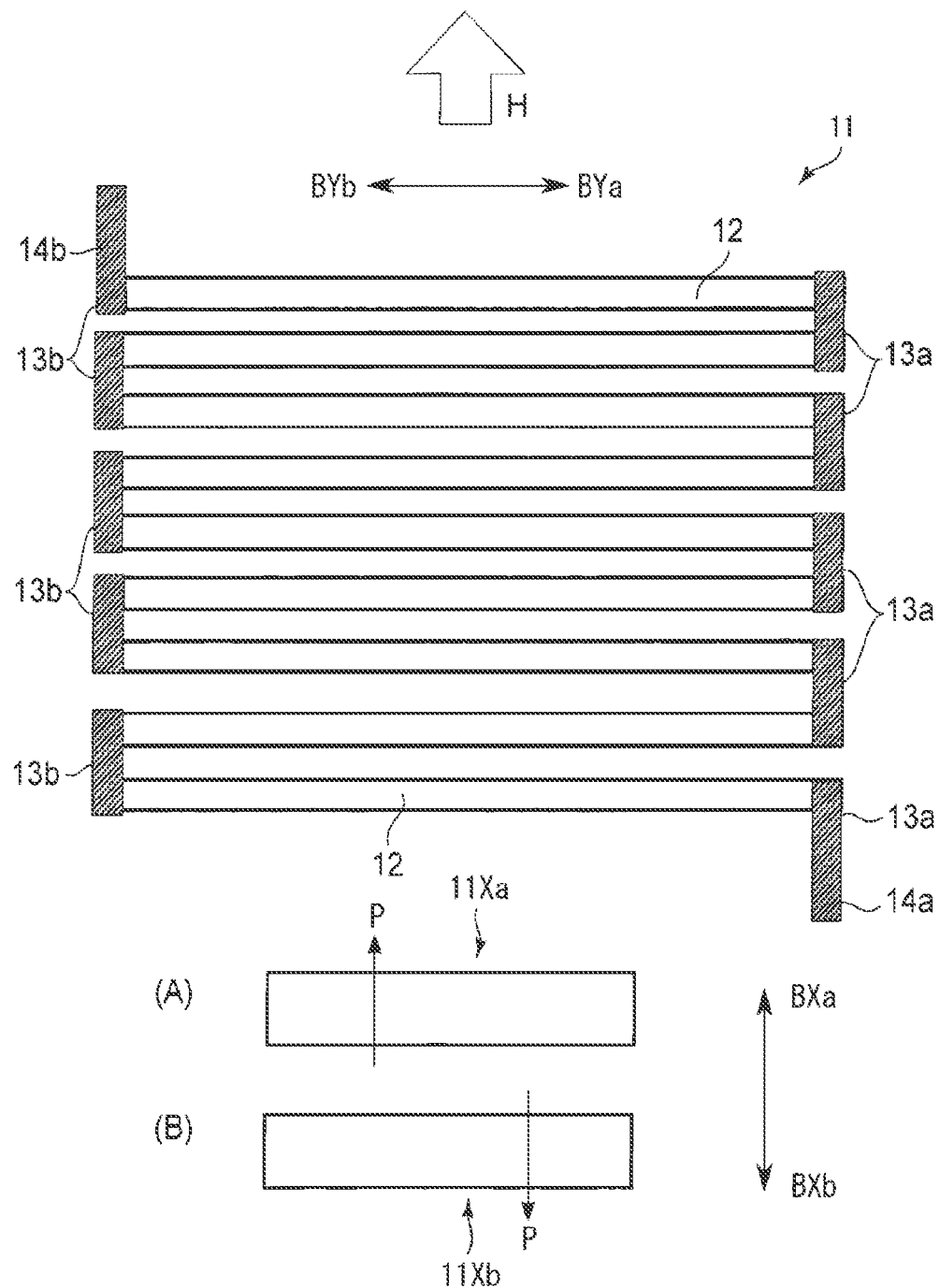
FIG. 4 is a planar view illustrating a magnetic detection device 11 used in a magnetic sensor 30.

FIG. 4 shows planar structures of the magnetic detection device 11Xa and the magnetic detection device 11Xb. In FIGS. 3 and 4, the BXa-BXb direction is the X direction. In (A) and (B) of FIG. 4, the fixed magnetization directions P of the magnetic detection devices 11Xa and 11Xb are indicated by the arrows. The fixed magnetization directions P in the magnetic detection device 11Xa and the magnetic detection device 11Xb are the respective X directions and are opposite to each other.

As shown in FIG. 4, the magnetic detection device 11Xa and the magnetic detection device 11Xb include stripe-shaped element portions 12. The element portions 12 each have the longitudinal direction in the BYa-BYb direction. The multiple element portions 12 are arrayed in parallel to each other. The illustrated right edges of adjacent element portions 12 are connected to each other via a conductive portion 13a, and the illustrated left edges of adjacent element portions 12 are connected to each other via a conductive portion 13b. The illustrated right ends and the illustrated left ends of the element portions 12 are alternately connected to the conductive portions 13a and 13b, and the element portions 12 are connected in a so-called meander shape. In the magnetic detection devices 11Xa and 11Xb, the conductive portion 13a illustrated at the lower right portion is united with a joining terminal 14a, and the conductive portion 13b illustrated at the upper left portion is united with a joining terminal 14b.

Each element portion 12 is composed of stacked multiple metal layers (alloy layers). FIG. 1 shows the layered structure of the element portions 12. Incidentally, each element portion 12 may have a layered structure shown in FIG. 2.

In the magnetic sensors 30 shown in FIGS. 3 and 4, it is possible to replace the magnetic detection device 11 with the magnetic detection device 21 of the second embodiment shown in FIG. 2.

Figure 5:
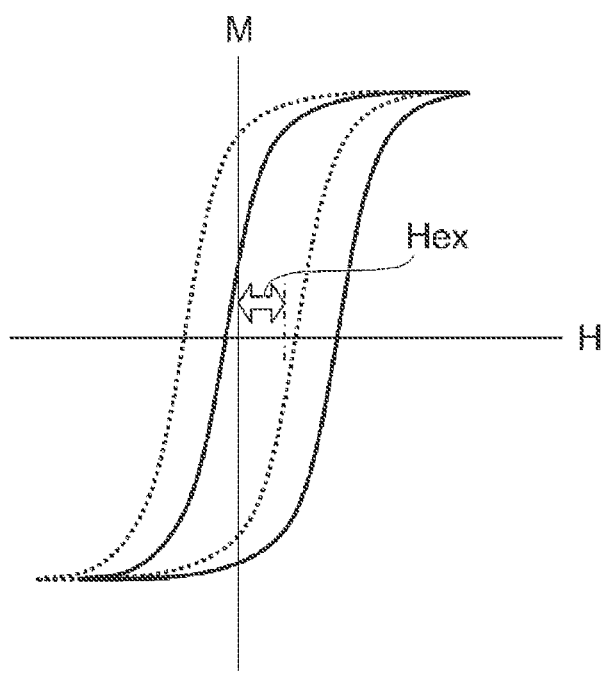
FIG. 5 is an explanatory drawing of the hysteresis loop of the magnetization curve of an exchange coupling film according to the present invention.

FIG. 5 is a graph explaining the hysteresis loop of the magnetization curve of an exchange coupling film according to the present invention. Generally, the hysteresis loop formed by the M-H curve (magnetization curve) of a soft magnetic material has a symmetrical shape around the intersection of the H-axis and the M-axis (external magnetic field H=0 A/m, magnetization M=0 A/m) as the center, as indicated by a dotted line in FIG. 5. However, the hysteresis loop of an exchange coupling film according to the present invention has a shape shifted along the H-axis depending on the size of an exchange coupling field Hex indicated by a solid line in FIG. 5 because the Hex acts on the fixed magnetic layer. The fixed magnetic layer of this exchange coupling film less likely reverses the direction of magnetization with an increase in the Hex, even if an external magnetic field is applied thereto, to improve the strong-magnetic field resistance.

In addition, the exchange coupling film according to the present invention has a large Hex, in particular, in a high-temperature environment by including the antiferromagnetic layer having a structure composed of a PtCr layer and an XMn layer (where X is Pt or Ir). Accordingly, the exchange coupling film according to the present invention has excellent strong-magnetic field resistance in a high-temperature environment.

Furthermore, a large Hex can be obtained between metal materials of a variety of compositions. The exchange coupling field Hex is generated by interaction between an antiferromagnetic layer and a fixed magnetic layer. Under such a circumstance, in the antiferromagnetic layer according to the present invention, the composition of the fixed magnetic layer that can suitably generate an exchange coupling field Hex is diverse and has a wide range. Specifically, not only a cobalt-iron alloy (CoFe alloy) or a nickel-iron alloy (NiFe alloy) but also until iron (Fe) or cobalt (Co) can be used as the material constituting the fixed magnetic layer. Accordingly, the degree of freedom in design of the fixed magnetic layer can be increased. In particular, iron (Fe), cobalt (Co), and alloys (e.g., 90CoFe alloy or 10CoFe alloy) having compositions similar to those of these metals have a low magnetostriction constant compared to alloys (e.g., 40CoFe) having other compositions. Accordingly, when the fixed magnetic layer is made of such a material, a defect in which the direction of magnetization of the exchange coupling field Hex changes due to the stress based on such magnetostriction less likely occurs.

EXAMPLES

Figure 6:
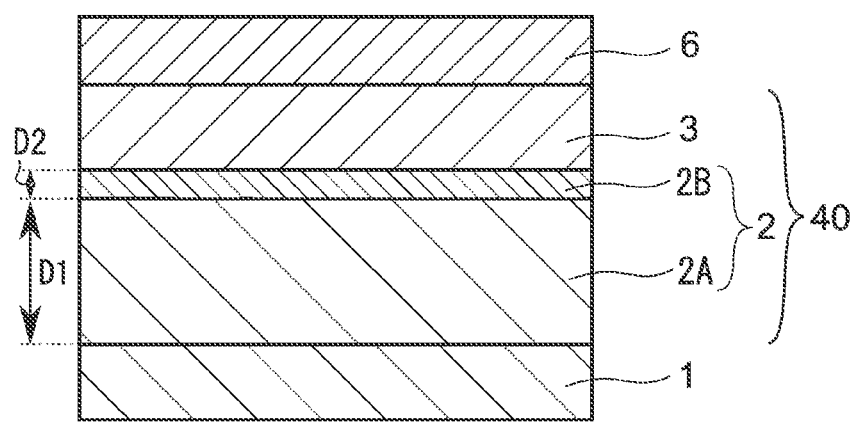
FIG. 6 is an explanatory drawing explaining the film configuration of the exchange coupling films 40 of Examples 1 to 4 and Comparative Examples 1 to 3.

FIG. 6 is an explanatory drawing explaining the film configuration of the exchange coupling film 40 of Examples 1 to 4 and Comparative Examples 1 to 3. Exchange coupling films having the configuration shown in the drawing were formed, and the relationship between temperature and Hex was measured.

Example 1

An exchange coupling film 40 having the following configuration was formed and annealed at 350° C. under a magnetic field strength of 1 kOe for 5 hours to fix the magnetization of the fixed magnetic layer 3 and the antiferromagnetic layer 2. The numerical values in parentheses in the following Examples and Comparative Examples show the thicknesses (angstrom).

Substrate/base layer 1: NiFeCr (42)/antiferromagnetic layer 2: $Pt_{51\ at\ \%}Cr_{49\ at\ \%}$ (280)/$Pt_{50\ at\ \%}Mn_{50\ at\ \%}$ (20)/fixed magnetic layer 3: $Co^{90\ at\ \%}Fe_{10\ at\ \%}$ (100)/protective layer 6: Ta (90)

Example 2

An exchange coupling film 40 having the same configuration as that in Example 1 was annealed at 400° C. instead of 350° C. in Example 1 under a magnetic field strength of 1 kOe for 5 hours to fix the magnetization of the fixed magnetic layer 3 and the antiferromagnetic layer 2.

Example 3

An exchange coupling film 40 was formed as in Example 1 except that the antiferromagnetic layer 2 was changed to $Pt_{54\ at\ \%}Cr_{46\ at\ \%}$ (280)/$Pt_{50\ at\ \%}Mn_{50\ at\ \%}$ (10) from $Pt_{51\ at\ \%}Cr_{49\ at\ \%}$ (280)/$Pt_{50\ at\ \%}Mn_{50\ at\ \%}$ (20) and was annealed at 400° C. instead of 350° C. in Example 1 under a magnetic field strength of 1 kOe for 5 hours to fix the magnetization of the fixed magnetic layer 3 and the antiferromagnetic layer 2.

Example 4

An exchange coupling film 40 was formed as in Example 1 except that the antiferromagnetic layer 2 was changed to $Pt_{54\ at\ \%}Cr_{46\ at\ \%}$ (280)/$Pt_{50\ at\ \%}Mn_{50\ at\ \%}$ (20) from $Pt_{51\ at\ \%}Cr_{49\ at\ \%}$ (280)/$Pt_{50\ at\ \%}Mn_{50\ at\ \%}$ (20) and was annealed at 400° C. instead of 350° C. in Example 1 under a magnetic field strength of 1 kOe for 5 hours to fix the magnetization of the fixed magnetic layer 3 and the antiferromagnetic layer 2.

Comparative Example 1

An exchange coupling film 40 was formed as in Example 1 except that the antiferromagnetic layer 2 was changed to $Pt_{50\ at\ \%}Mn_{50\ at\ \%}$ (300) from $Pt_{51\ at\ \%}Cr_{49\ at\ \%}$ (280)/$Pt_{50\ at\ \%}Mn_{50\ at\ \%}$ (20) and was annealed at 400° C. instead of 350° C. in Example 1 under a magnetic field strength of 1 kOe for 5 hours to fix the magnetization of the fixed magnetic layer 3 and the antiferromagnetic layer 2.

Comparative Example 2

An exchange coupling film 40 was formed as in Example 1 except that the antiferromagnetic layer 2 was changed to $Ir_{20\ at\ \%}Mn_{80\ at\ \%}$ (80) from $Pt_{51\ at\ \%}Cr_{49\ at\ \%}$ (280)/$Pt_{50\ at\ \%}Mn_{50\ at\ \%}$ (20) and was annealed at 400° C. instead of 350° C. in Example 1 under a magnetic field strength of 1 kOe for 5 hours to fix the magnetization of the fixed magnetic layer 3 and the antiferromagnetic layer 2.

Comparative Example 3

An exchange coupling film 40 was formed as in Example 1 except that the antiferromagnetic layer 2 was changed to $Pt_{51\ at\ \%}Cr_{49\ at\ \%}$ (300) from $Pt_{51\ at\ \%}Cr_{49\ at\ \%}$ (280)/$Pt_{50\ at\ \%}Mn_{50\ at\ \%}$ (20) and was annealed at 400° C. instead of 350° C. in Example 1 under a magnetic field strength of 1 kOe for 5 hours to fix the magnetization of the fixed magnetic layer 3 and the antiferromagnetic layer 2.

Regarding the exchange coupling films 40 of Examples 1 to 4 and Comparative Examples 1 to 3, the results of measurement of a change in Hex due to a change in temperature are shown in Tables 1 to 3. Tables 1 to 3 show the exchange coupling field Hex (unit: Oe) determined from a hysteresis loop obtained by measuring the magnetization curve at each temperature of the exchange coupling film according to each of Examples and Comparative Examples with a VSM (vibrating sample magnetometer) and the normalized Hex obtained by dividing the Hex at each temperature by the Hex at room temperature.

TABLE 1

| Example 1 | | | Example 2 | | |
|---|---|---|---|---|---|
| Temperature (° C.) | Hex (Oe) | Normalized Hex | Temperature (° C.) | Hex (Oe) | Normalized Hex |
| 24 | 335 | 1.00 | 22 | 400 | 1.00 |
| 40 | 330 | 0.99 | 44 | 400 | 1.00 |
| 64 | 330 | 0.99 | 63 | 385 | 0.96 |
| 84 | 320 | 0.96 | 84 | 385 | 0.96 |
| 104 | 325 | 0.97 | 104 | 375 | 0.94 |
| 125 | 310 | 0.93 | 124 | 380 | 0.95 |
| 143 | 305 | 0.91 | 146 | 360 | 0.90 |
| 163 | 305 | 0.91 | 164 | 350 | 0.88 |
| 183 | 295 | 0.88 | 185 | 355 | 0.89 |
| 203 | 295 | 0.88 | 204 | 345 | 0.86 |
| 223 | 295 | 0.88 | 224 | 340 | 0.85 |
| 266 | 285 | 0.85 | 266 | 340 | 0.85 |
| 305 | 250 | 0.75 | 307 | 305 | 0.76 |
| 344 | 245 | 0.73 | 345 | 265 | 0.66 |
| 384 | 205 | 0.61 | 385 | 220 | 0.55 |
| 423 | 180 | 0.54 | 424 | 165 | 0.41 |
| 462 | 130 | 0.39 | 463 | 110 | 0.28 |
| 500 | 50 | 0.15 | 500 | 25 | 0.06 |

TABLE 2

| Example 3 | | | Example 4 | | |
|---|---|---|---|---|---|
| Temperature (° C.) | Hex (Oe) | Normalized Hex | Temperature (° C.) | Hex (Oe) | Normalized Hex |
| 25 | 485 | 1.00 | 22 | 530 | 1.00 |
| 42 | 485 | 1.00 | 42 | 540 | 1.02 |
| 66 | 485 | 1.00 | 63 | 525 | 0.99 |
| 85 | 483 | 0.99 | 84 | 540 | 1.02 |
| 104 | 480 | 0.99 | 104 | 525 | 0.99 |
| 124 | 480 | 0.99 | 125 | 510 | 0.96 |
| 145 | 478 | 0.98 | 144 | 510 | 0.96 |
| 165 | 478 | 0.98 | 165 | 500 | 0.94 |
| 185 | 470 | 0.97 | 184 | 480 | 0.91 |
| 205 | 475 | 0.98 | 204 | 480 | 0.91 |
| 224 | 470 | 0.97 | 224 | 475 | 0.90 |
| 268 | 453 | 0.93 | 268 | 465 | 0.88 |
| 283 | 435 | 0.90 | — | — | — |
| 302 | 415 | 0.86 | 305 | 425 | 0.80 |
| 345 | 350 | 0.72 | 345 | 395 | 0.75 |
| 385 | 280 | 0.58 | 385 | 365 | 0.69 |
| 423 | 198 | 0.41 | 424 | 275 | 0.52 |
| 462 | 110 | 0.23 | 463 | 165 | 0.31 |
| 500 | 20 | 0.04 | 500 | 50 | 0.09 |

TABLE 3

| Comparative Example 1 | | | Comparative Example 2 | | | Comparative Example 3 | | |
|---|---|---|---|---|---|---|---|---|
| Temperature (° C.) | Hex (Oe) | Normalized Hex | Temperature (° C.) | Hex (Oe) | Normalized Hex | Temperature (° C.) | Hex (Oe) | Normalized Hex |
| 22 | 278 | 1.00 | 22 | 83 | 1.00 | 24 | 118 | 1.00 |
| 42 | 278 | 1.00 | 42 | 79 | 0.95 | 48 | 116 | 0.99 |
| 64 | 270 | 0.97 | 64 | 76 | 0.92 | 64 | 116 | 0.99 |
| 84 | 273 | 0.98 | 84 | 73 | 0.88 | 83 | 119 | 1.01 |
| 104 | 265 | 0.95 | 104 | 65 | 0.79 | 104 | 120 | 1.02 |
| 124 | 258 | 0.93 | 124 | 63 | 0.76 | 125 | 119 | 1.01 |
| 145 | 250 | 0.90 | 144 | 55 | 0.67 | 145 | 118 | 1.00 |
| 163 | 240 | 0.86 | 165 | 50 | 0.61 | 164 | 118 | 1.00 |
| 185 | 233 | 0.84 | 181 | 46 | 0.56 | 184 | 115 | 0.98 |
| 204 | 228 | 0.82 | 201 | 38 | 0.45 | 204 | 113 | 0.96 |
| 224 | 213 | 0.77 | 220 | 34 | 0.41 | 240 | 108 | 0.91 |
| 255 | 165 | 0.59 | 259 | 14 | 0.17 | 286 | 96 | 0.82 |
| 304 | 98 | 0.35 | 304 | 0 | 0.00 | 326 | 60 | 0.51 |
| 344 | 45 | 0.16 | — | — | — | — | — | — |
| 362 | 40 | 0.14 | — | — | — | 363 | 34 | 0.29 |
| 403 | 5 | 0.02 | — | — | — | 403 | 18 | 0.15 |
| 422 | 0 | 0.00 | — | — | — | 422 | 10 | 0.09 |
| — | — | — | — | — | — | 460 | 3.5 | 0.03 |
| — | — | — | — | — | — | 500 | 2.5 | 0.02 |

Figure 7:
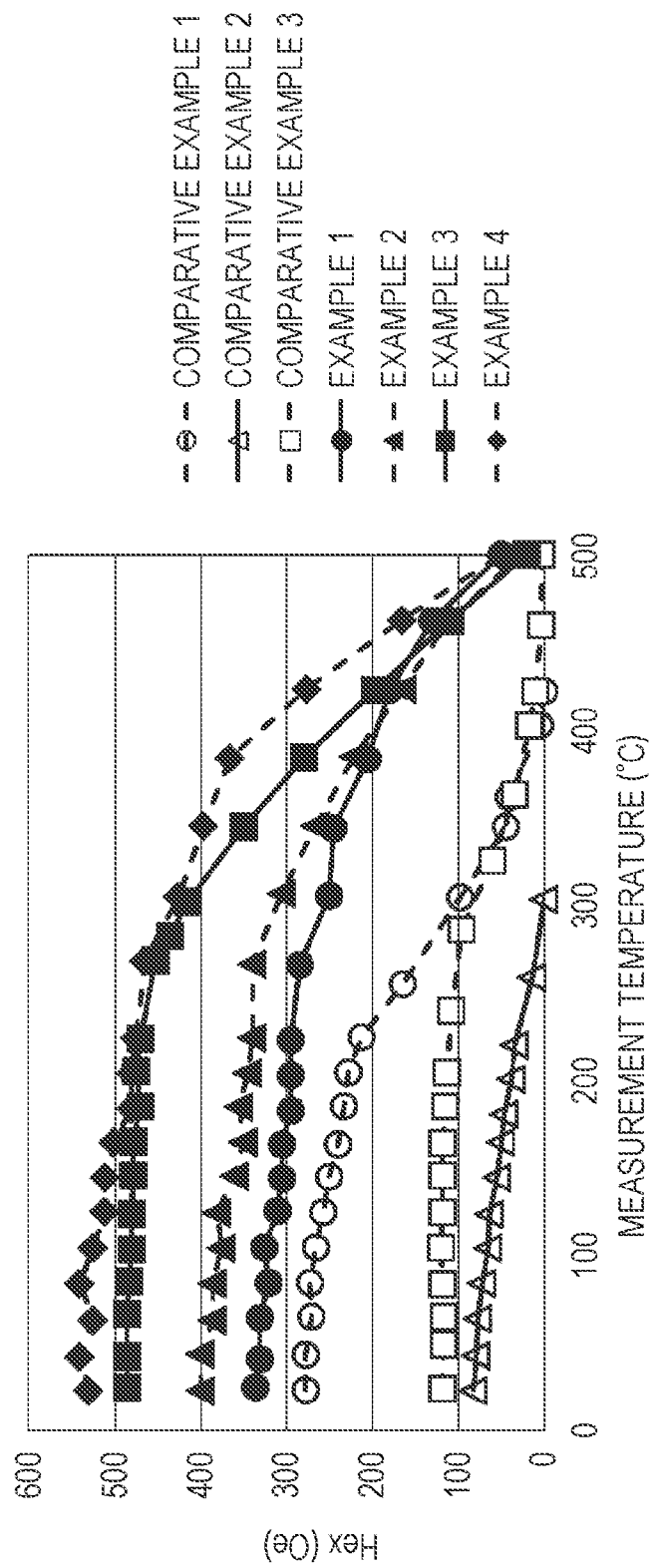
FIG. 7 is a graph showing a relationship between the temperature and the Hex of each of the exchange coupling films of Examples 1 to 4 and Comparative Examples 1 to 3.

FIG. 7 is a graph showing a relationship between the temperature and the Hex of each of the exchange coupling films 40 of Examples 1 to 4 and Comparative Examples 1 to 3. As shown in the graph of FIG. 7 summarizing Tables 1 to 3, in the exchange coupling films 40 of Examples 1 to 4, the Hex value under high-temperature conditions was high.

Figure 8:
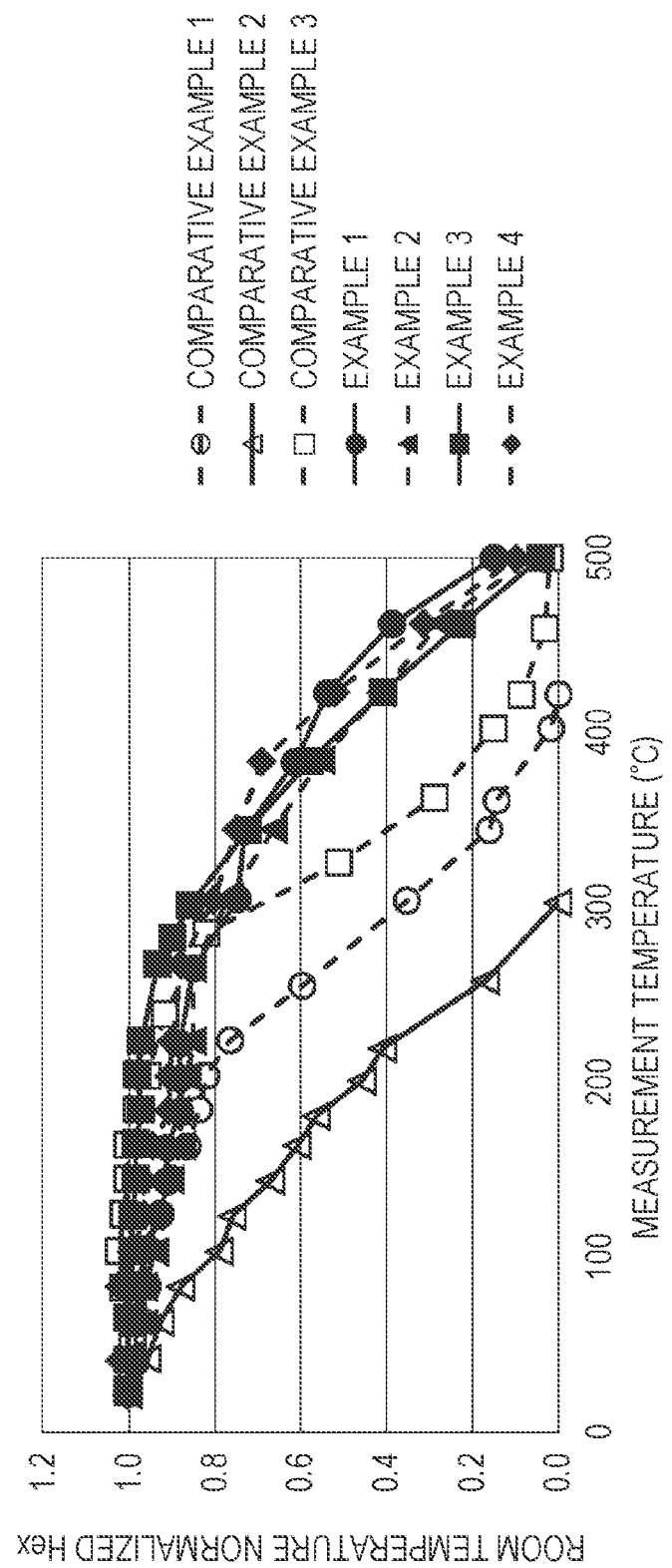
FIG. 8 is a graph showing the normalized Hex obtained by dividing the Hex at each temperature of the exchange coupling film of FIG. 7 by the Hex at room temperature.

FIG. 8 is a graph showing the normalized Hex obtained by dividing the Hex at each temperature of the exchange coupling film of FIG. 7 by the Hex at room temperature. As shown by the graph, in the exchange coupling films 40 of Examples 1 to 4, the Hex in a high-temperature environment of 300° C. was about 75% to 85% of the Hex at room temperature. Thus, the reduction rate of the Hex from that at room temperature was small.

As shown by the graphs of FIGS. 7 and 8, the exchange coupling films 40 of Examples 1 to 4 including a PtCr layer and a PtMn layer as the antiferromagnetic layer 2 had high Hex values under room temperature and high-temperature conditions, and the reduction rate of the Hex due to an increase in temperature was small, compared to the exchange coupling films 40 of Comparative Examples 1 to 3 including an antiferromagnetic layer 2 made of a PtMn, IrMn, or PtCr layer only.

Example 5

An exchange coupling film having the following configuration was formed and annealed at 350° C. under a magnetic field strength of 1 kOe for 20 hours to fix the magnetization of the fixed magnetic layer 3 and the antiferromagnetic layer 2.

Substrate/base layer 1: NiFeCr (42)/non-magnetic material layer 4: [Cu (40)/Ru (10)]/fixed magnetic layer 3: $Co_{60\ at\ \%}Fe_{40\ at\ \%}$ (100)/antiferromagnetic layer 2: $Pt_{50\ at\ \%}Mn_{50\ at\ \%}$ (12)/$Pt_{51\ at\ \%}Cr_{49\ at\ \%}$ (280)/protective layer 6: Ta(90)

Example 6

An exchange coupling film was formed as in Example 5 except that the antiferromagnetic layer 2 was changed to $Pt_{50\ at\ \%}Mn_{50\ at\ \%}$ (18)/$Pt_{51\ at\ \%}Cr_{49\ at\ \%}$ (280) from $Pt_{50\ at\ \%}Mn_{50\ at\ \%}$ (12)/$Pt_{51\ at\ \%}Cr_{49\ at\ \%}$ (280) and was annealed at 350° C. under a magnetic field strength of 1 kOe for 20 hours to fix the magnetization of the fixed magnetic layer 3 and the antiferromagnetic layer 2 as in Example 5.

Regarding the exchange coupling films of Examples 5 and 6, Table 4 shows the normalized Hex obtained by measuring the exchange coupling field Hex (unit: Oe) with a VSM (vibrating sample magnetometer) and dividing it by the Hex at room temperature.

TABLE 4

| Example 5 | | Example 6 | |
|---|---|---|---|
| Temperature (° C.) | Normalized Hex | Temperature (° C.) | Normalized Hex |
| 22 | 1.00 | 22 | 1.00 |
| 63 | 1.00 | 68 | 0.97 |
| 106 | 0.97 | 108 | 0.93 |
| 123 | 0.97 | 125 | 0.90 |
| 145 | 0.95 | 145 | 0.89 |
| 165 | 0.93 | 166 | 0.88 |
| 183 | 0.89 | 184 | 0.83 |
| 202 | 0.87 | 204 | 0.82 |
| 220 | 0.85 | 224 | 0.79 |
| 262 | 0.80 | 265 | 0.74 |
| 306 | 0.75 | 305 | 0.66 |
| 341 | 0.68 | 344 | 0.60 |
| 382 | 0.61 | 382 | 0.51 |
| 421 | 0.52 | 422 | 0.38 |
| 462 | 0.37 | 462 | 0.19 |
| — | — | 481 | 0.08 |
| 500 | 0.15 | 500 | 0.03 |

Figure 9:
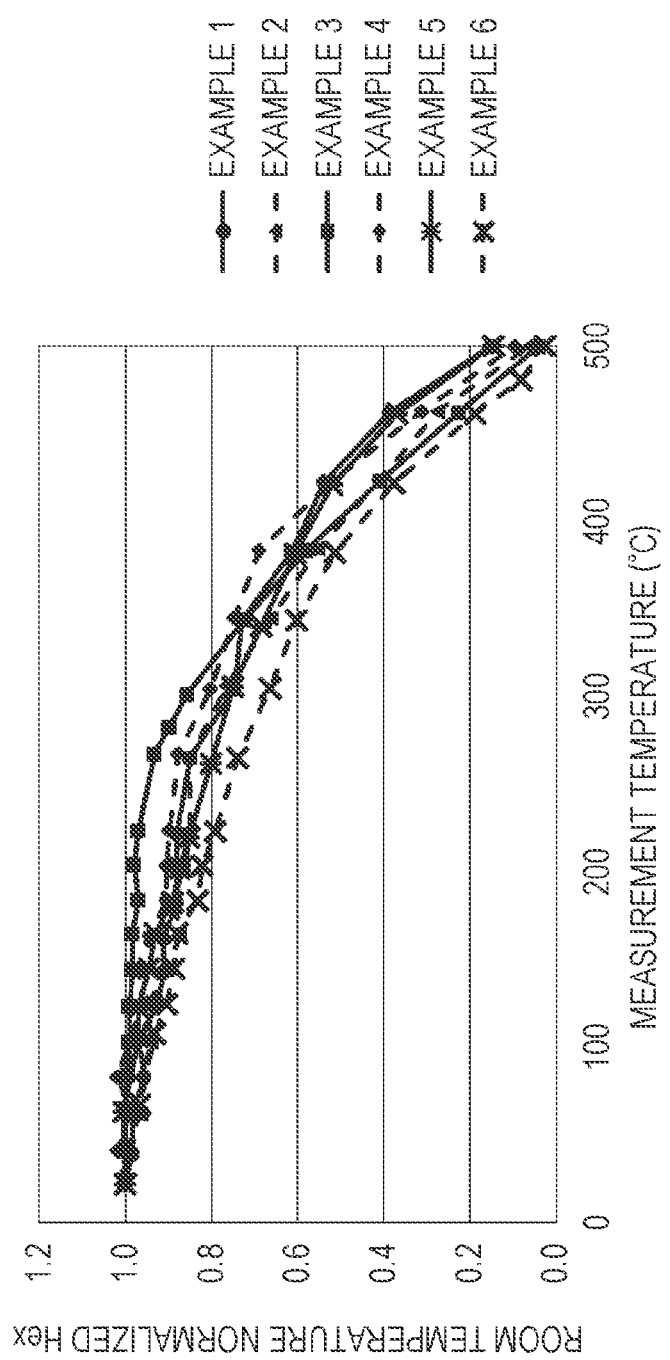
FIG. 9 is a graph showing the normalized Hex obtained by dividing the Hex at each temperature of each of the exchange coupling films of Examples 1 to 6 by the Hex at room temperature.

FIG. 9 is a graph showing the normalized Hex obtained by dividing the Hex at each temperature of each of the exchange coupling films of Examples 1 to 6 by the Hex at room temperature. As shown by the graph summarizing the results of Table 4, in Examples 5 and 6 using $Co_{60\ at\ \%}Fe_{40\ at\ \%}$ as the fixed magnetic layer 3, the high-temperature stability was good as in Examples 1 to 4 using $Co_{90\ at\ \%}Fe_{10\ at\ \%}$ as the fixed magnetic layer 3.

Example 7

Exchange coupling films having the following configuration were formed by changing the Fe amount X (at %) in the fixed magnetic layer 3 to 0, 10, 20, 30, 40, 50, 60, 70, 80, 90, and 100 and were annealed at 350° C. under magnetic field strength of 1 kOe for 20 hours to fix the magnetization of the fixed magnetic layer 3 and the antiferromagnetic layer 2.

Substrate/base layer 1: NiFeCr (40)/non-magnetic intermediate layer 4: [Cu (40)/Ru (10)]/fixed magnetic layer 3: $Co_{(100-X\ at\ \%)}Fe_{X\ at\ \%}$ (50)/antiferromagnetic layer 2: $Pt_{48\ at\ \%}Mn_{52\ at\ \%}$(20)/$Pt_{51\ at\ \%}Cr_{49\ at\ \%}$ (280)/protective layer 6: Ta (50)

Example 8

An exchange coupling film was formed as in Example 7 and was annealed at 400° C. instead of 350° C. in Example 7 under a magnetic field strength of 1 kOe for 20 hours to fix the magnetization of the fixed magnetic layer 3 and the antiferromagnetic layer 2.

Comparative Example 4

Exchange coupling films having the following configuration were formed by changing the Fe amount X (at %) in the fixed magnetic layer 3 to 0, 10, 20, 30, 40, 50, 60, 70, 80, 90, and 100 and were annealed at 350° C. under magnetic field strength of 1 kOe for 20 hours to fix the magnetization of the fixed magnetic layer 3 and the antiferromagnetic layer 2.

Substrate/base layer 1: NiFeCr (40)/non-magnetic intermediate layer 4: [Cu (40)/Ru (10)]/fixed magnetic layer 3: $Co_{(100-X\ at\ \%)}Fe_{X\ at\ \%}$ (50)/antiferromagnetic layer 2: $Ir_{22\ at\ \%}Mn_{78\ at\ \%}$ (80)/protective layer 6: Ta (50)

Regarding the exchange coupling films of Examples 7 and 8 and Comparative Example 4, Table 5 shows the results of measurement of the exchange coupling field Hex (unit: Oe) with a VSM (vibrating sample magnetometer), and Table 6 shows the exchange coupling energy per unit area ($erg/cm^2$).

TABLE 5

| | Hex (exchange coupling field, Oe) | | |
|---|---|---|---|
| Fe amount in layer (at %) | Example 7 Annealing temperature 350° C. | Example 8 Annealing temperature 400° C. | Comparative Example 4 Annealing temperature 350° C. |
| 0 | 325 | 725 | 41 |
| 10 | 413 | 825 | 63 |
| 20 | 388 | 838 | 82 |
| 30 | 538 | 875 | 182 |
| 40 | 488 | 870 | 174 |
| 50 | 513 | 850 | 155 |
| 60 | 475 | 875 | 150 |
| 70 | 425 | 863 | 135 |
| 80 | 413 | 838 | 90 |
| 90 | 425 | 813 | 75 |
| 100 | 338 | 400 | 68 |

TABLE 6

| | Exchange coupling energy ($erg/cm^2$) | | |
|---|---|---|---|
| Fe amount in layer (at %) | Example 7 Annealing temperature 350° C. | Example 8 Annealing temperature 400° C. | Comparative Example 4 Annealing temperature 350° C. |
| 0 | 0.26 | 0.55 | 0.03 |
| 10 | 0.34 | 0.60 | 0.04 |
| 20 | 0.34 | 0.65 | 0.06 |
| 30 | 0.54 | 0.74 | 0.16 |
| 40 | 0.52 | 0.76 | 0.17 |
| 50 | 0.55 | 0.82 | 0.16 |
| 60 | 0.51 | 0.82 | 0.15 |
| 70 | 0.48 | 0.85 | 0.13 |
| 80 | 0.43 | 0.74 | 0.09 |
| 90 | 0.42 | 0.69 | 0.07 |
| 100 | 0.32 | 0.32 | 0.07 |

Figure 10:
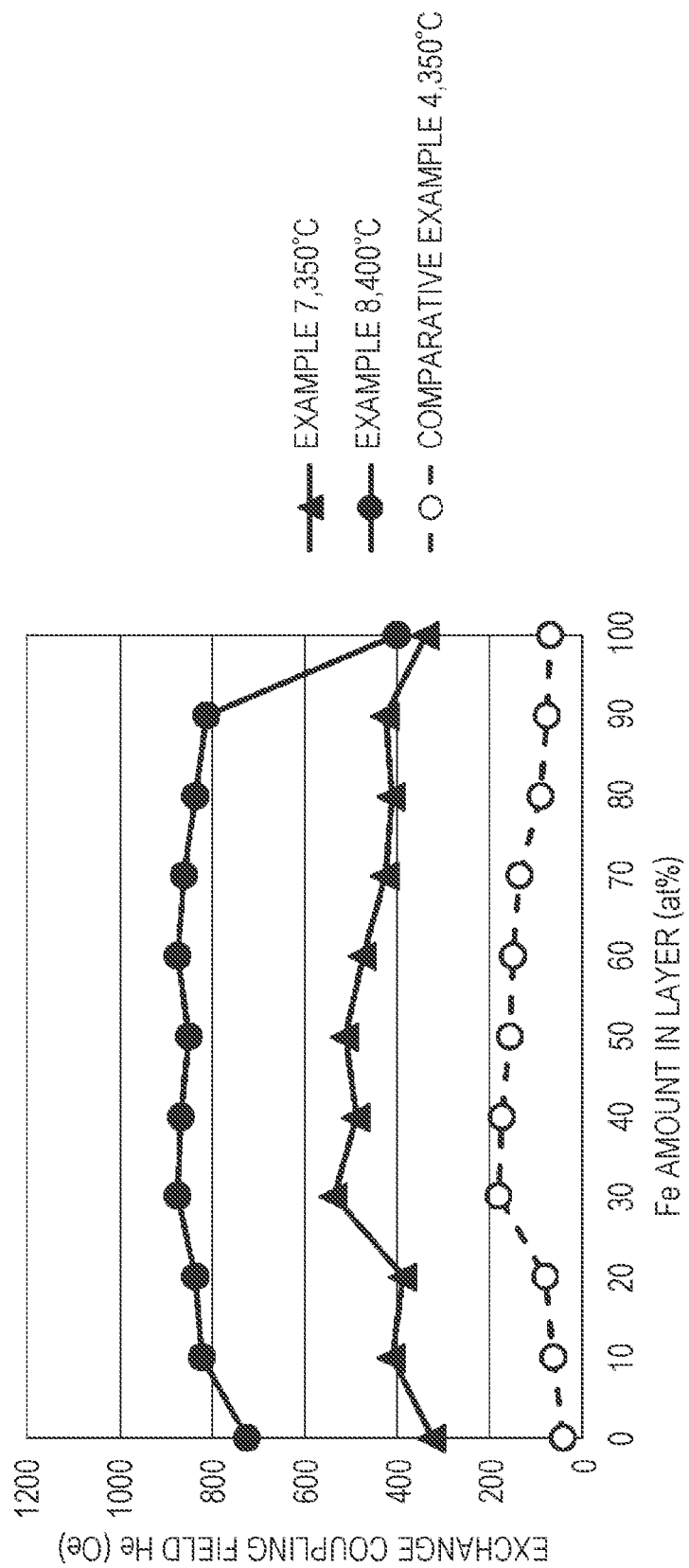
FIG. 10 is a graph showing the Hex of each of the exchange coupling films of Examples 7 and 8 and Comparative Example 4.
Figure 11:
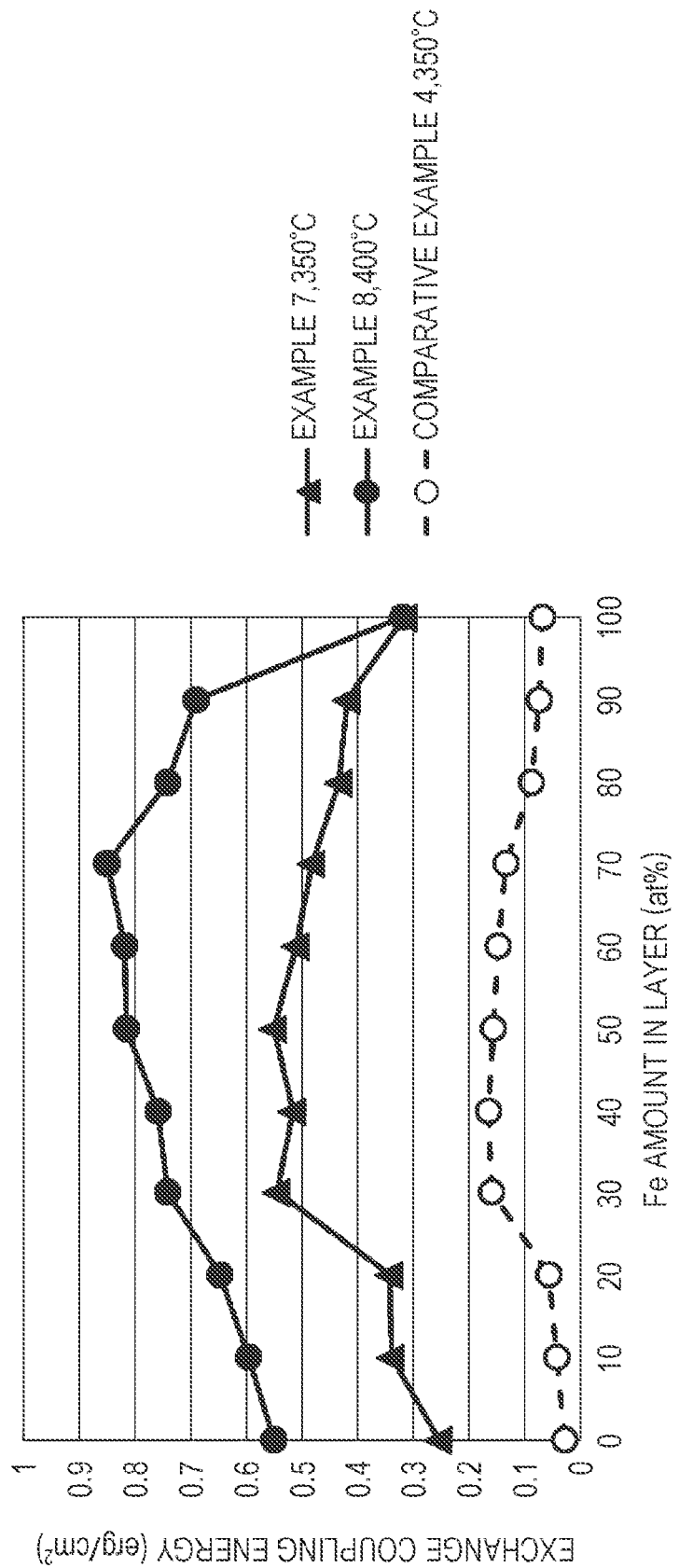
FIG. 11 is a graph showing the exchange coupling energy of Examples 7 and 8 and Comparative Example 4.

FIGS. 10 and 11 are graphs showing the exchange coupling field Hex (Oe) and the exchange coupling energy ($erg/cm^2$) of the exchange coupling films of Examples 7 and 8 and Comparative Example 4. As shown by the graphs summarizing Tables 5 and 6, it was demonstrated that the exchange coupling film using $Pt_{48\ at\ \%}Mn_{52\ at\ \%}$ (20)/$Pt_{51\ at\ \%}Cr_{49\ at\ \%}$ (280) as the antiferromagnetic layer 2 had high exchange coupling field Hex and exchange coupling energy even if $Co_{(100-X\ at\ \%)}Fe_{X\ at\ \%}$ (50) (X=0 to 100) was used as the fixed magnetic layer 3. Thus, when an antiferromagnetic layer 2 composed of a PtCr layer and an XMn layer (where X is Pt or Ir) is used, an exchange coupling film 10 having a high exchange coupling field Hex can be obtained using a variety of metals as the fixed magnetic layer 3. Accordingly, since a CoFe alloy that is used as the fixed magnetic layer 3 can be determined by giving priority to, for example, properties such as magnetostriction, the exchange coupling film 10 has a high degree of freedom in design.

What is claimed is:
1. An exchange coupling film comprising:
    a laminate of an antiferromagnetic layer and a fixed magnetic layer, wherein:
    the antiferromagnetic layer is composed of a PtCr layer consisting of Pt and Cr and an XMn layer (where X is Pt or Ir);
    the XMn layer is in contact with the fixed magnetic layer; and
    the fixed magnetic layer comprises one of iron, cobalt, a cobalt-iron alloy, or a nickel-iron alloy.
2. The exchange coupling film according to claim 1, wherein:
    the PtCr layer has a thickness larger than that of the XMn layer.
3. The exchange coupling film according to claim 2, wherein
    a ratio of the thickness of the PtCr layer and the thickness of the XMn layer is 5:1 to 100:1.
4. A magnetoresistive sensor comprising:
    a laminate of the exchange coupling film according to claim 1 and a free magnetic layer.
5. A magnetic detector comprising:
    a plurality of the magnetoresistive sensors according to claim 4.
6. The magnetic detector according to claim 5, wherein
    a plurality of the magnetoresistive sensors according to claim 4 are provided on a single substrate; and
    the plurality of the magnetoresistive sensors include those having different fixed magnetization directions.

7. The exchange coupling film according to claim 1, wherein X in the XMn layer is Pt.

8. The exchange coupling film according to claim 1, wherein the fixed magnetic layer comprises a metal consisting of more than 70 at % and 100 at % or less of Fe and the balance of Co.

9. The exchange coupling film according to claim 1, wherein the fixed magnetic layer comprises a metal consisting of 80 at % or more and 100 at % or less of Fe and the balance of Co.

10. The exchange coupling film according to claim 1, wherein the fixed magnetic layer comprises a metal consisting of 0 at % or more and less than 20 at % of Fe and the balance of Co.

11. The exchange coupling film according to claim 1, wherein the fixed magnetic layer comprises a metal consisting of 0 at % or more and 10 at % or less of Fe and the balance of Co.

12. The exchange coupling film according to claim 1, wherein the fixed magnetic layer comprises a metal consisting of 10 at % or more and 90 at % or less of Fe and the balance of Co.

13. The exchange coupling film according to claim 1, wherein the fixed magnetic layer comprises a metal consisting of 10 at % or more and 20 at % or less of Fe and the balance of Co or a metal consisting of more than 70 at % and 100 at % or less of Fe and the balance of Co.

14. The exchange coupling film according to claim 1, wherein the PtCr layer comprises a metal consisting of 45 at % or more and 62 at % or less of Pt and the balance of Cr.

15. An exchange coupling film comprising:
a laminate of an antiferromagnetic layer and a fixed magnetic layer, wherein:
the antiferromagnetic layer is composed of a PtCr layer consisting of Pt and Cr and an XMn layer (where X is Pt or Ir);
the XMn layer is in contact with the fixed magnetic layer;
the fixed magnetic layer has a self-pinned structure composed of a laminate of a first magnetic layer, an intermediate layer, and a second magnetic layer; and
the first magnetic layer and the second magnetic layer are comprised of one of iron, cobalt, a cobalt-iron alloy, or a nickel-iron alloy.

16. The exchange coupling film according to claim 15, wherein X in the XMn layer is Pt.

17. The exchange coupling film according to claim 15, wherein the fixed magnetic layer comprises a metal consisting of more than 70 at % and 100 at % or less of Fe and the balance of Co.

18. The exchange coupling film according to claim 15, wherein the fixed magnetic layer comprises a metal consisting of 0 at % or more and less than 20 at % of Fe and the balance of Co.

19. The exchange coupling film according to claim 15, wherein the fixed magnetic layer comprises a metal consisting of 10 at % or more and 20 at % or less of Fe and the balance of Co or a metal consisting of more than 70 at % and 100 at % or less of Fe and the balance of Co.

20. The exchange coupling film according to claim 15, wherein the PtCr layer comprises a metal consisting of 45 at % or more and 62 at % or less of Pt and the balance of Cr.

* * * * *